(12) United States Patent
Hutchins

(10) Patent No.: US 6,373,707 B1
(45) Date of Patent: Apr. 16, 2002

(54) MODULE MOUNTING SLIDE CLAMP MECHANISM

(75) Inventor: Michael Hutchins, Beaconsfield (CA)

(73) Assignee: Astec International Limited (HK)

( * ) Notice: Subject to any disclaimer, the term of this patent is extended or adjusted under 35 U.S.C. 154(b) by 0 days.

(21) Appl. No.: 09/585,264

(22) Filed: Jun. 2, 2000

(51) Int. Cl.[7] .............................................. G06F 1/16
(52) U.S. Cl. ...................... 361/725; 361/727; 312/333; 312/334.11; 211/41.17
(58) Field of Search .................... 361/725, 683–685, 361/724, 726, 727, 730, 732, 752; 312/333, 332.11, 334.11, 334.18; 308/3.6, 3.8; 211/41.17, 41.18

(56) References Cited

U.S. PATENT DOCUMENTS

| | | |
|---|---|---|
| 1,653,530 A | 2/1927 | Abrachinsky |
| 2,236,938 A | 4/1941 | Edelen ........................ 292/288 |
| 2,789,024 A | 4/1957 | Heisler ........................ 312/333 |
| 3,371,968 A | 3/1968 | Loake ........................ 308/3.6 |
| 4,384,746 A | 5/1983 | Ferdinand et al. ........... 308/3.6 |
| 4,423,914 A | 1/1984 | Ley ............................ 312/333 |
| 4,473,262 A | 9/1984 | Staye .......................... 312/333 |
| 4,560,212 A | 12/1985 | Papp et al. ................... 308/3.8 |
| 4,681,381 A | 7/1987 | Sevey ......................... 312/333 |
| 4,979,909 A | 12/1990 | Andrews ..................... 439/352 |
| 5,262,923 A | 11/1993 | Batta et al. .................. 361/685 |
| 5,507,571 A | 4/1996 | Hoffman .................. 312/334.8 |
| 5,577,821 A | 11/1996 | Chu ....................... 312/334.11 |
| 5,626,406 A | 5/1997 | Schmid ................. 312/334.28 |
| 5,632,542 A | 5/1997 | Krivec .................... 312/334.7 |
| 5,671,988 A | 9/1997 | O'Neill ................. 312/334.44 |
| 5,683,159 A | 11/1997 | Johnson ................... 312/334.7 |
| 5,785,401 A | 7/1998 | Bowyer et al. .............. 312/350 |
| 5,806,949 A | 9/1998 | Johnson .................... 312/334.7 |
| 5,984,442 A | 11/1999 | Hellman, Jr. ........... 312/334.12 |
| 6,155,661 A | * 12/2000 | O'Neil et al. ........... 312/334.44 |
| 6,229,708 B1 | * 5/2001 | Corbin, Jr. et al. ......... 361/725 |
| 6,238,031 B1 | * 5/2001 | Weng .......................... 312/333 |
| 6,257,683 B1 | * 7/2001 | Yang ........................... 312/333 |

* cited by examiner

Primary Examiner—Leo P. Picard
Assistant Examiner—Hung Van Duong
(74) Attorney, Agent, or Firm—Coudert Brothers LLP

(57) ABSTRACT

A slide assembly has a first portion which is mounted to a chassis and a second portion which is mounted to vertical support members of a rack assembly for supporting the chassis. In the preferred embodiment of the invention, the slide assembly includes a pair of slide members, each of which has a movable track member, a flange, a clamp, a latch, and a spring-loaded releasable lock actuator. The flange includes a bracket which is used to mount the slide member to the rack assembly without the use of tools or fasteners. The track member is coupled to the flange and slidably moves on the flange between an inner locked operational position and an outer extended position relative to the rack assembly. The clamp and latch are both spring-loaded to engage each other and to prevent movement of the chassis when pushed into the operational position. Electrical mating connectors disposed on the electrical components supported by the chassis and disposed at the rear portion of the rack assembly are coupled together when the chassis is pushed into the rack assembly and comes to be locked in the operational position. In an alternative embodiment, multiple latches are provided to enable the slide assembly to be locked in three positions, namely inner, intermediate and outer positions. A spring-loaded lock actuator is used in both embodiments to disengage the clamp from the locked positions.

20 Claims, 7 Drawing Sheets

MODULE MOUNTING SLIDE CLAMP MECHANISM

FIELD OF THE INVENTION

The present invention relates generally to the field of slide assemblies of the type used for mounting drawers and shelving modules for sliding components into and out of rack assemblies, cabinets and other support structures or framework.

BACKGROUND OF THE INVENTION

Slide assemblies are conventionally known to function with low friction so as to support a drawer, tray or other shelving module (henceforth interchangeably referred to as a "chassis") within a cabinet, framework, vertical support member, rack or other support structure (henceforth interchangeably referred to as "rack assembly") and to permit the supported chassis to be opened and closed relatively easily therewith. This operation is especially useful for servicing heavy objects being supported by the chassis, simply by opening and closing the chassis generally with minimal effort. In the area of power distribution systems used for telecommunications applications, large and heavy electrical components forming part of the system are supported by the chassis, which is in turn mounted upon a rack assembly for loading components into and out of the rack assembly. Generally, the conventional slide assemblies are installed on the chassis, as well as on the rack assembly, and may be opened for installation and servicing of the electrical components and closed for normal operation of the distribution system.

Conventional slide assemblies, though, typically require installation in the nature of mounting the slide assembly on both the chassis as well as on the rack assembly. This requires the use of additional tooling (e.g., screws, bolts, screw-drivers, fasteners, wrenches) as well as a considerable amount of time for installation. When field upgrades and maintenance of the slide assembly or of the system's electrical components must be undertaken, the same additional tooling is typically required upon disassembly of the parts to be changed. This type of servicing results in substantial down-time (i.e., non-operational time) of the system, which must be electrically and operationally disengaged for safety reasons prior to servicing. This down-time in turn causes a loss of productivity.

Accordingly, what is needed is a slide assembly that is readily and easily installed upon a rack assembly so as to decrease the installation service time. The time to replace a slide assembly includes the time to: (1) disengage power to the system's components; (2) remove any exterior housing elements surrounding the components and fastening connectors; (3) withdraw the chassis from the rack assembly; (4) remove the components from the chassis and disconnect any fasteners or connectors (e.g., screws); (5) remove the slide assembly from the rack assembly and the chassis; (6) reposition and fasten a new slide assembly to the rack assembly and chassis; (7) test the operation of the slide assembly; (8) arrange the system's components back onto the chassis; (9) reposition the chassis within the rack assembly; (10) reinstall any exterior housing elements and any fastening connectors; (11) activate power back to the system's components: and (11) test if the system is functional. These steps are highly undesirable because they are labor intensive and time-consuming to perform. Thus, it would be ideal if the conventional slide assembly were improved to be easily installed and removed from the chassis and rack assembly, preferably without the need for additional tools or fasteners, thereby also reducing down-time for field replacement and maintenance of the slide assembly.

None of the known conventional slide assemblies appear to address the above identified undesirable steps in a fully satisfactory manner in addition to having the slide assembly that may be kept captive on both sides of a chassis in an inner locked operational position relative to the rack assembly. Rather, they possess a number of problems in addition to their general failure to address the desirable functional features of easy, quick and simple installation and removal. One key problem is the lack of ability to "hot plug" electrical equipment supported on the chassis into mating connectors disposed at the rear of the rack assembly.

Other drawbacks of conventional slide assemblies include problems with the complexity of their design such as with telescoping slides, which contain many parts forming a comparatively complicated linkage mechanism that adds significantly to the cost and complexity of assembly and materials. In addition, these slide assemblies are bulky and large, often occupying a larger area of space that could otherwise be used for the components of the particular application being mounted on the rack assemble and supported by the slide assembly. Their bulkiness is also a drawback leading to awkward handling of the slide assembly during installation.

Other conventional slide assemblies enable the chassis to be pulled out of the rack assembly for servicing of the electrical components supported thereon. These conventional slide assemblies permit the electrical connections to such components to be disengaged by decoupling the electrical wire connectors made to the components supported on the chassis. For example in telecommunication applications, electrical units supported on the chassis are coupled at the rear of the rack assembly to various electrical connections (e.g. AC input power DC data bus slots, data line slots). Physically decoupling these connectors to service the system supported on the chassis, when the chassis is pulled out of the rack assembly, is problematic because of the tight physical constraints within the rack assembly. This makes the servicing of components not only awkward but also logistically cumbersome when decoupling these electrical connectors. This problem is exacerbated when these connectors are mounted toward the rear portion of the components or electrical systems supported by the chassis. Accordingly, what is needed is an improve slide assembly wherein corresponding mating connectors may be located, guided to, coupled together and decoupled easily and quickly by facilitating the "hot plugging" of connector members disposed on the electrical components being supported on the chassis with the mating connector members disposed at the rear of the rack assembly.

What is desired is a slide assembly to be constructed with a relatively simpler design than conventional slide assemblies, one that preferably does not require additional tools and fasteners, especially once the slide assembly is mounted onto the chassis for installation and de-installation with the rack assembly. The slide assembly must be durable, unlike many conventional slide assemblies with their short operational life and frequently break-down with constant usage. What would be ideal is a low-cost slide assembly that operates upon a simpler design than conventional slide assemblies without components that frequently need to be maintained. It would be beneficial if the slide assembly were compact in nature in terms of having a minimal size, minimal cross-sectional width and height, and consequently a lighter weight.

SUMMARY OF THE INVENTION

The preferred embodiment of the present invention is directed towards a slide assembly having a first portion which is mounted to vertical support members of a rack assembly, and a second portion which is mounted to a chassis being supported in the rack assembly. The slide assembly includes a pair of slide members, each of which comprises: a movable track member; a flange; a clamp; a latch; and a spring-loaded releasable lock actuator. The track member includes: a first surface opposed from a second surface and being adapted so that the second surface engages a corresponding one of opposed sides of the chassis; a front portion; a back portion; a notch including a first cam surface disposed near the back portion; top and bottom edges shaped to form channels along the first surface; at least one of the channels having a first stop member near the front portion; a first opening disposed substantially in between the back portion and the front portion; and means for mounting the slide assembly to the chassis. The flange has: a first surface opposed from a second surface; a bracket extending from the second surface of the flange and including cooperating portions for mounting the flange with a corresponding one of the vertical support members, wherein the flange further has top and bottom edges each being received by a corresponding one of the channels and is enabled to permit slidable movement of the track member along the flange when the first surface of the flange abuts the first surface of the track member; and a second opening extending through the first surface of the flange and through the second surface of the flange. The clamp is pivotably supported by the flange and spring-loaded so as to be normally biased in a direction from the second surface of the flange towards the first surface of the flange, whereby the clamp is urged through the second opening to engage the first surface of the track member during the slidable movement and to latch into the notch for preventing the slidable movement beyond the back portion. The first stop member prevents the slidable movement beyond the front portion. The latch is substantially resilient and has a spring support member, and a second cam surface leading to a second stop member. The spring-loaded releasable lock actuator is coupled to the latch and has: a handle, a first surface opposed from a second surface; a third opening adapted to include a vertical edge opposed from a first extension and adapted for retaining the chassis in a locked operational position relative to the support members when the second cam surface extends therethrough and when said second stop member engages said first extension; and a fourth opening for receiving means for attaching the latch to the track member, wherein the handle is positioned to extend away from the front portion of the track member, wherein the slidable movement is permitted when unlocking said the track member out of the operational position by actuating said handle to slide the lock actuator towards the front portion to thereby cause the vertical edge to slide along the second cam surface and to retract the second stop member from the third opening and out of engagement with the clamp.

There are several key technical features of the present invention, the first of which is that each side of the chassis includes a track member which engages a flange. Also, the pivoting clamp is activated as the chassis is pushed into the rack assembly; this helps to press-fit and keep captive the chassis to the flange because the L-shaped bracket is pressed against the side wall of the track member.

Another key technical feature is that "hot plugging" of electrical units that are supported on the chassis is permitted with electrical connectors disposed at the rear of the rack assembly upon pushing the chassis into the rack assembly to rest at its inner or locked operational position. This permits various electrical connections (e.g., AC input power. DC data bus slots, data line slots) associated with the telecommunication applications to be operational upon installation of the chassis. The electrical units have corresponding mating connectors that are coupled to such electrical connections. The affirmative latching of the chassis in a locked operational position occurs via a spring-loaded slide assembly relative to the rack assembly so that various mating connectors disposed on the electrical equipment supported by the chassis may be plugged into corresponding various electrical connections disposed at the rear of the rack assembly, and so that no movement of the chassis may occur until the spring-loaded slide assembly is physically disengaged from the operational position by a user.

Yet another important technical advantage of the slide assembly of the present invention is that it is mountable upon the rack assembly without the need for additional tools. Using an interlock mechanism that is generally simple and requires cost-effective construction the slide assembly may be installed without tools, and is therefore field replaceable without tools. This feature is particularly desirable as the interlock mechanism enables the chassis to support heavy loads.

In an alternative embodiment, the slide assembly of the present invention permits the chassis to be latched in inner, intermediate and outside positions relative to the rack assembly. This feature provides an additional degree of access to the electrical components supported by the chassis for servicing and field replacement of such.

These and other objects of the present invention will become apparent to those skilled in the art from the following detailed description and from the detailed drawings.

DETAILED DESCRIPTION OF THE INVENTION

The present invention generally comprises a slide assembly having slide members coupled to each side of a chassis which: (1) allow simple and quick installation and de-installation on the rack assembly for supporting the chassis because no additional tools are required; (2) provides a simple design of a spring-loaded slide assembly with only a minimal number of parts in addition to a pivoting spring-loaded clamp engaging a latch to prevent slidable movement of the track member; (3) facilitates easy access to components supported on the chassis by permitting one or more positions with which the chassis may be moved out of the rack assembly for servicing of the components supported thereon; (4) minimizes the down-time of components and systems supported thereon during maintenance and field replacement of the slide assembly; (5) provides the additional benefit of being compact in size so as to comply with the tight space constraints of electronic components supported on the chassis; (6) is durable and able to support the mechanical stress of a heavy load, but lightweight; and (7) allows electrical connections to be made between connectors disposed on the electrical equipment supported by the chassis with the connector modules located at the rear of the rack assembly by simply pushing the chassis into the locked operational position relative to the rack assembly.

Figure 1:
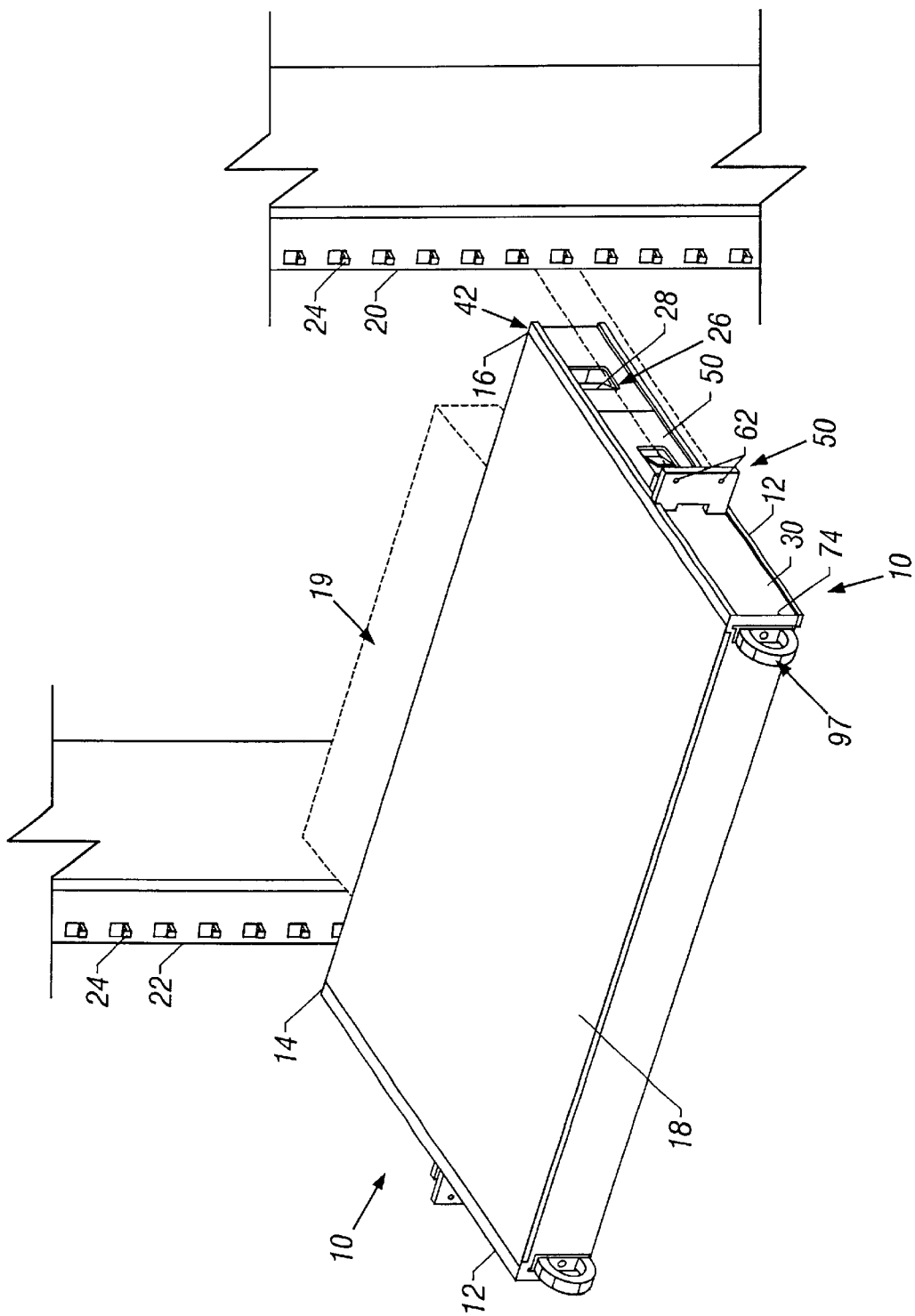
FIG. 1 is a front perspective and partially cutaway view of the slide assembly supported by the rack assembly according to a preferred embodiment of the present invention.

FIG. 1 is a front perspective and partially cutaway view of a preferred embodiment of the slide assembly 10 of the present invention. The slide assembly includes a pair of slide members 12 supported by opposed sides 14, 16 of a chassis 18 for mounting with a pair of stable rack assemblies 20, 22. An additional extension 19 of chassis 18 may be optionally coupled thereto to support more electrical equipment thereon. Each slide member 12 is identical in every respect but for their orientation relative to being supported by the particular side of the chassis. In the telecommunications field, the components that are typically supported on chassis 18 include rectifiers that are a part of high-powered telecommunications system applications and are required to be operational all of the time. As is conventionally known, the chassis functions as a drawer and may be pulled from the rack assembly to an outer position for servicing of system components supported thereon, or pushed into an inner position relative to the rack assembly during normal operation of the system. When installed with the rack assembly, the chassis is supported in a stable fashion and typically permitted to slide into and out of the rack assembly primarily for maintenance and servicing of the system. However, as will be described later in detail with an alternative embodiment, the slide assembly of the present invention may have three positions: an inner, outer and intermediate position. As best visualized in FIG. 1, interengageable mating members disposed on the slide member 12 and the rack assembly 20, 22 permit the chassis to be mounted on the rack assembly and demounted for removal, effectively separating the mating members, both without the use of tools and fasteners. These interengageable mating members are discussed in further detail below.

Figure 2:
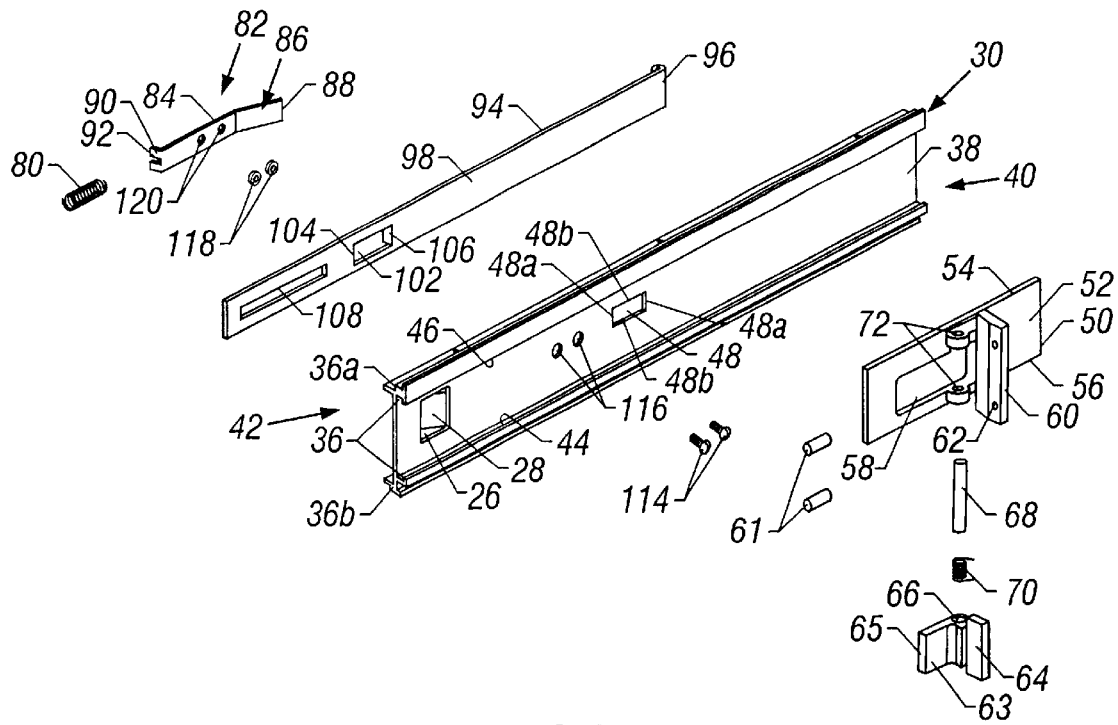
FIG. 2 is an exploded front perspective view of a slide member for the slide assembly of FIG. 1.
Figure 4:
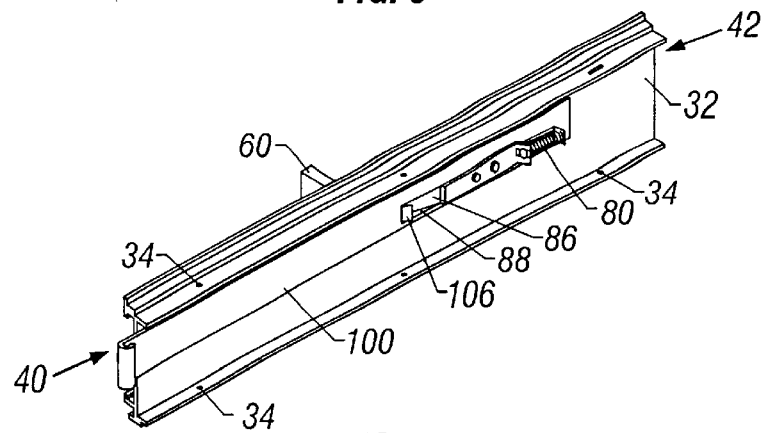
FIG. 4 is a rear perspective view of the slide member of FIG. 2.

FIG. 2 shows an exploded front perspective view of a slide member 12 having a movable track member 30, also known as a glide or slide. Track member 30 includes a first surface 32, seen most clearly in FIG. 4 showing a perspective rear view of the slide member, which is coupled to and may engage opposed sides 14, 16 of chassis 10 by threaded holes 34 enabling screws (not shown) to fasten the track member 30 to threaded holes (not shown) on the chassis 10, although other conventional ways know in the art to fasten track member 30 to the chassis 10 may be used (e.g., threaded holes enabling screws to fasten the track member to the chassis, glue, clips, snap-fit connectors, slidable tracks, etc.). Additionally, track member 30 may also be manufactured as an integral part of the chassis 18.

Referring back to FIG. 2, track member 30 has a track 36 disposed on an opposed second surface 38, and a notch 26 cut into a back (or rear) portion 42 of the slide member. As will be described further, notch 26 provides a relief in the nature of a flange bent in the direction of surface 32 to create a cam portion 28. The back portion 42 of the slide member is that portion positioned closest to the interior of the rack assembly. By contrast, slide member 30 includes a front portion 40 disposed towards the front exterior of the rack assembly and most immediately accessible to a user. Track 36 comprises opposed channels 36a, 36b which may be formed from top and bottom edges 44, 46 bent to form lips along surface 38. Near the center portion of track member 30 is an opening 48 rectangular in shape and preferably formed by cutting techniques performed on a dedicated progressive punch and die set. Opening 48 includes two opposed vertical edges 48a and two opposed horizontal edges 48b.

Slide member 12 also includes a plate or flange 50 having a first surface 52 and an opposite surface (not shown, but facing into the page) for engaging surface 38 of the track member 30 when assembled therewith. Flange 50 further has opposed top and bottom edges 54, 56, an opening 58 substantially rectangular in shape and extending through surface 52 through the opposed surface of the flange, and an L-shaped bracket 60 extending from surface 52. Edges 54, 56 are each received by a corresponding one of channels 36a, 36b and are enabled to permit slidable movement of track member 30 along flange 50 when the surface opposed to surface 52 of the flange abuts surface 38 of the track member. Bracket 60 includes a portion of the interengageable mating members already discussed, in particular, cooperating portions for mounting the flange with a corresponding one of the vertical support members of the rack assembly. As seen in FIG. 1, these cooperating portions include holes 62 adapted for mating with male locating pins 24, forming the portion of the interengageable mating members disposed on the rack assembly. It will be appreciated by those of ordinary skill in the art that a number of techniques for mounting the flange securely to the rack assembly may be used, so long as consistent with facilitating simple and quick installation and de-installation of the slide assembly without the use of additional tooling or fasteners. Several exemplary techniques include, for e.g., guide pins and locking pin slots, pressure-loaded clips. interlocking hooks, etc.

Flange 50 is coupled to clamp means comprising a clamp 64 generally being L-shaped in configuration, having an end portion 65, and being pivotably supported thereon. As seen in FIG. 2, clamp 64 includes a bore 66 defined therethrough for receiving a support pin 68. Clamp 64 includes a surface (i.e., into the page) opposite of surface 63 shown in FIG. 2. Although not immediately shown, support pin 68 is also inserted into a center bore formed by the coil of a spring 70. The flange 50 includes two bores 72 for receiving the assembly of the support pin inserted through the spring 70 and bore 66. The technique of assembling clamp 64 to be spring-loaded is conventionally known and will not be described in detail.

There are a number of ways for attaching the flange to the rack assembly without the use of tools or fasteners. In one embodiment, the rack assembly 20, 22 includes interengageable portions adapted to receive and releaseably engage cooperating portions located on the flange. These interengageable portions may be conventional male interlock members, each being a single piece formed to extend from the plane of the rack assembly. Although shown to be generally rectangular in FIG. 1, it will become readily apparent to those skilled in the art that a number of shapes for the male interlock are feasible (e.g., partially cylindrical, pins inserted into pin holes and engaging pin slots) so long as consistent with providing a hook-like function for engaging the cooperating portions disposed on the flange and permitting the flange to hang from the rack assembly in a releasable but stable manner. As seen best in FIG. 2, the bracket 60 may include two apertures 62 for receiving two guide pins 61 that extend therethrough and into similar apertures (not shown) located on the rack assembly. In general, to ensure secure coupling between the bracket and the rack assembly, each aperture also has a length and width slightly larger than the length and width of the corresponding male interlock members so as to create a friction-fit therewith.

Once flange 50 is assembled within track 36, track member 30 is slidably movable between the back portion and the front portions of track member 30. In order to contain the flange 50 within track member 30, that is from becoming dislodged from track member 30, stop members are placed near the front and back portions. This may be accomplished in a variety of ways. Near the front portion, a facade 74 is positioned to prevent flange 50 from sliding beyond the proximal portion and becoming dislodged from channel 36, as seen in FIG. 1, although other conventional ways known in the art to provide a stop member for one end of a track may be used (e.g., stop pin, notched tab on track 36, etc.). Near the back portion, clamp 64 is normally biased in a direction from the surface 52 of the flange through opening 58. It will become readily apparent to those skilled in the art that clamp 64 is urged through opening 58 to engage the surface 38 of the track member 30 during the slidable movement. When opening 58 becomes aligned with notch 26, the spring-loaded clamp 64 is urged through opening 58 and into notch 26, thereby engaging the cam portion 28. This operation occurs when the flange 50 is near the distal portion 40 and helps to keep the flange 50 captive within the channel 36. Therefore, it will be readily apparent to those skilled in the art that the interengagement of clamp 64 with notch 26 prevents slidable movement generally beyond the back portion of track member 30.

The slide member 12 also includes means for latching track member 30 in a locked operational position relative to the vertical support members of the rack assemblies 20, 22 and for releasing the track member 30 from the locked operational position. As seen in FIG. 2, slide member 12 further includes a compression spring 80 having a coil with a bore defined therein, a latch 82 and a releasable lock actuator 94. Latch 82 is preferably manufactured from a malleable metal so as to be resilient and flexible as a leaf spring, which is conventionally known in the art. Latch 82 has a base portion 84 leading to a wedge-shaped portion which forms a cam surface 86 and is bent to form a stop member 88, and a spring support member 90 which functions as a retention member for keeping spring 80 in place relative to the releasable lock actuator described below. As seen in FIG. 2, the retention member is shown as a pair of tabs extending from the base portion 84 of latch 82 and defining an opening 92, although other embodiments of the retention member may be used as will be discussed later.

Figure 3:
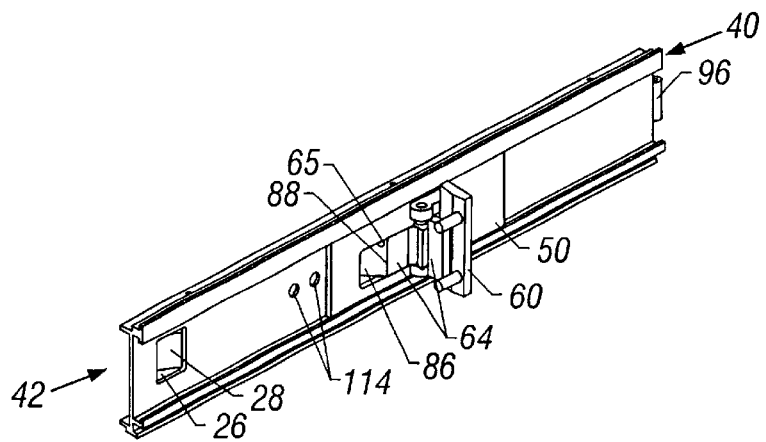
FIG. 3 is a front perspective view of the slide member of FIG. 2.
Figure 5A:
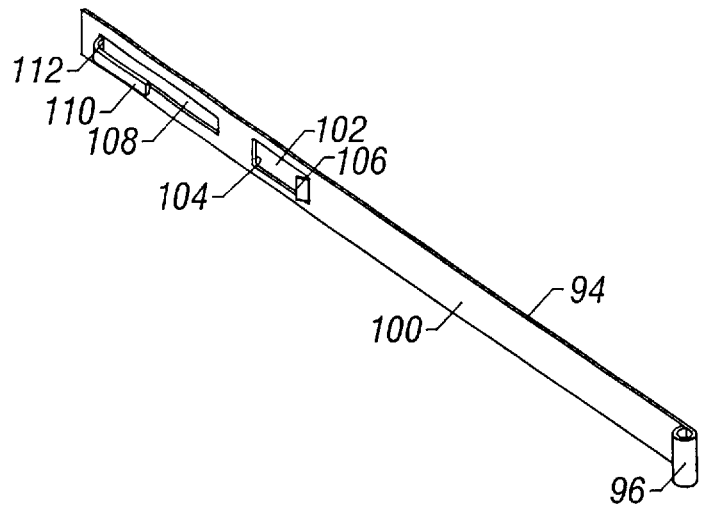
FIG. 5a is a perspective view and FIG. 5b top view of a releasable lock actuator of the present invention.
Figure 5B:
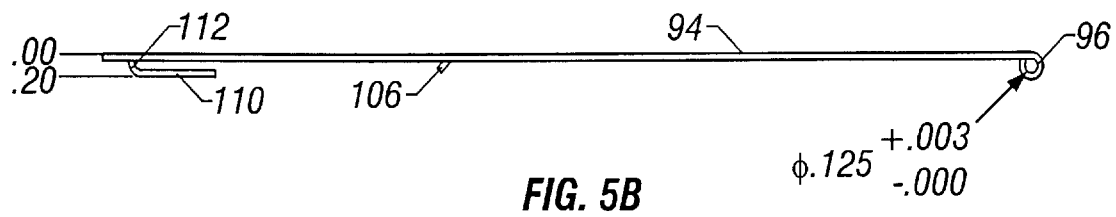

FIGS. 5a and 5b show, respectively, a perspective view and a top view of a releasable lock actuator 94 having a handle 96 formed at one end, a first surface 98 (shown in FIG. 2) and an opposed surface 100 as seen more clearly in the rear perspective view of the slide member shown in FIG. 4. When actuator 94 is assembled with the track member 30, surface 98 abuts surface 32. Actuator 94 further includes an opening 102 adapted to include a vertical edge 104 opposed from a cutaway extension 106 preferably cut and bent away from surface 100. Extension 106 is adapted for retaining the chassis in a locked operational position relative to the rack assemblies 20, 22 when the cam surface 86 protrudes through opening 102 and when the stop member 88 engages the first extension 106, as will be described below. Actuator 94 further includes an opening 108 that is generally elongated for receiving means for attaching the latch 82 to the track member 30, and an arm 10 extending from the surface 100 of the lock actuator. Arm 110 is formed to include an elbow 112 coupled to surface 100 of the lock actuator. The latch 82 is supported by the track member 30 when surface 98 of the lock actuator 94 engages surface 32 of the track member as seen more clearly in FIG. 4. When the slide assembly 10 is constructed, arm 110 is inserted through the bore of the compression spring 80 so that one end of the spring abuts the elbow 112. The means for attaching the latch 82 to track member 30 may include any known conventional technique for fastening components together so long as consistent with having the means for attaching the latch extending through opening 108 and being slidably movably along the horizontal directions therein. As seen in FIG. 2, the means for attaching the latch comprises screws 114 received through threaded screw openings 116, through opening 108, through apertures disposed within washers 118, and through threaded screw holes 120 disposed within the base portion 84 of latch 82. It will be apparent to the skilled artisan that the means for attaching the latch may include other known techniques so long as consistent with the disclosure herein. The retention member is then used to engage arm 110 so as to keep spring 80 constrained about arm 110 as seen in FIG. 4. When supported by track member 30, latch 82 engages actuator 94 such that: (1) arm 110 extends through opening 92 to thereby keep spring 80 captive about arm 110; (2) handle 96 is disposed beyond the front portion 40 of the track member so as to be easily grasped by a user; (3) opening 102 is aligned with opening 48 to permit cam surface 86 to protrude therethrough as seen more clearly in FIG. 3; and (4) spring 80 is biased (i.e., expanded) slightly from its resting position of zero potential energy so as to urge track member towards the inner position relative to the rack assemblies 20, 22. But in doing so, stop member 88 that is adjacent to cam surface 86 engages end portion 65 and extension 106 to prevent track member 30 from moving inward, thereby locking the track member 30 in an operational position (i.e., closed) with respect to the rack assembly 20, 22.

To release latch 82 and permit slidable movement of track member 30 when pulling chassis 18 to its outer position, the same means for latching the track member in a locked operational position relative to the vertical support members of the rack assemblies are used as means for releasing the track member from the locked operational position and are supported by the track member. In particular, handle 96 is pulled by a user to thereby impart a horizontal sliding movement of actuator 94 and to compress spring 80 which will want to return to an uncompressed position. It will be appreciated that a variety of embodiments for the handle may be used, including pull rings 97 shown in FIG. 1. Alternatively, other types of conventionally known handles may be used, e.g., rotational handles imparting the rotational movement of the handle to a translational movement of the actuator may also be used so long as consistent with the disclosure made herein, and finger activated handles 95 in FIG. 7. Unlocking the track member 30 out of the operational position is performed when disengaging latch 82 by pulling handle 96 so as to cause arm 110 to slidably move out of the rack assembly directly with the movement of actuator 94, which in turn causes: (1) spring 80 to be compressed and to want to retract upon releasing the handle thereby, moving actuator 94 towards the rack assembly; (2) the opening 108 to slide towards the front portion with screws 114 passing therein; and (3) the vertical edge 104 to slide along cam surface 86 so as to deflect cam surface 86 and to disengage stop member 88 with end portion 65 of clamp 64. Once the cam surface 86 is no longer protruding through openings 48, 58 and 102, the handle may be released upon which spring 80 will return to its position of being slightly expanded to thereby pull actuator 94 towards the rack assembly. Having released the latch therefrom, track member 30 may be slidably pulled to its outer position while clamp 64 engages surface 38 until opening 58 is aligned with notch 26 to thereby permit clamp 64 to be urged therethrough and into notch 26, causing surface opposite of surface 63 to engage cam portion 28. In this outer position, the chassis is fully extended from the rack assemblies 20, 22 and servicing of the system and components being supported on chassis 18 may be performed. When this task is completed, the chassis may be pushed into the rack assemblies, which sliding motion causes the surface (i.e., into the page) opposite of surface 63 to slide along cam portion 28 and become disengaged with notch 26. As the chassis is pushed further into the rack assembly, clamp 64 continues to slide along the surface 38 of track member 30 until opening 48 is aligned with opening 102 so as to permit cam surface 86 to be urged therethrough and protrude beyond opening 58. This arrangement enables end portion 65 of the clamp to engage stop member 88. Back in this inner or locked operational position, the combination of stop member 88 engaging end portion 65 prevents track member 30 from being pushed into the rack assembly, and the potential energy stored in spring 80 from being slightly expanded keeps track member 30 from being pulled out of the rack assemblies, thereby locking the track member stable in the operational position.

Figure 6:
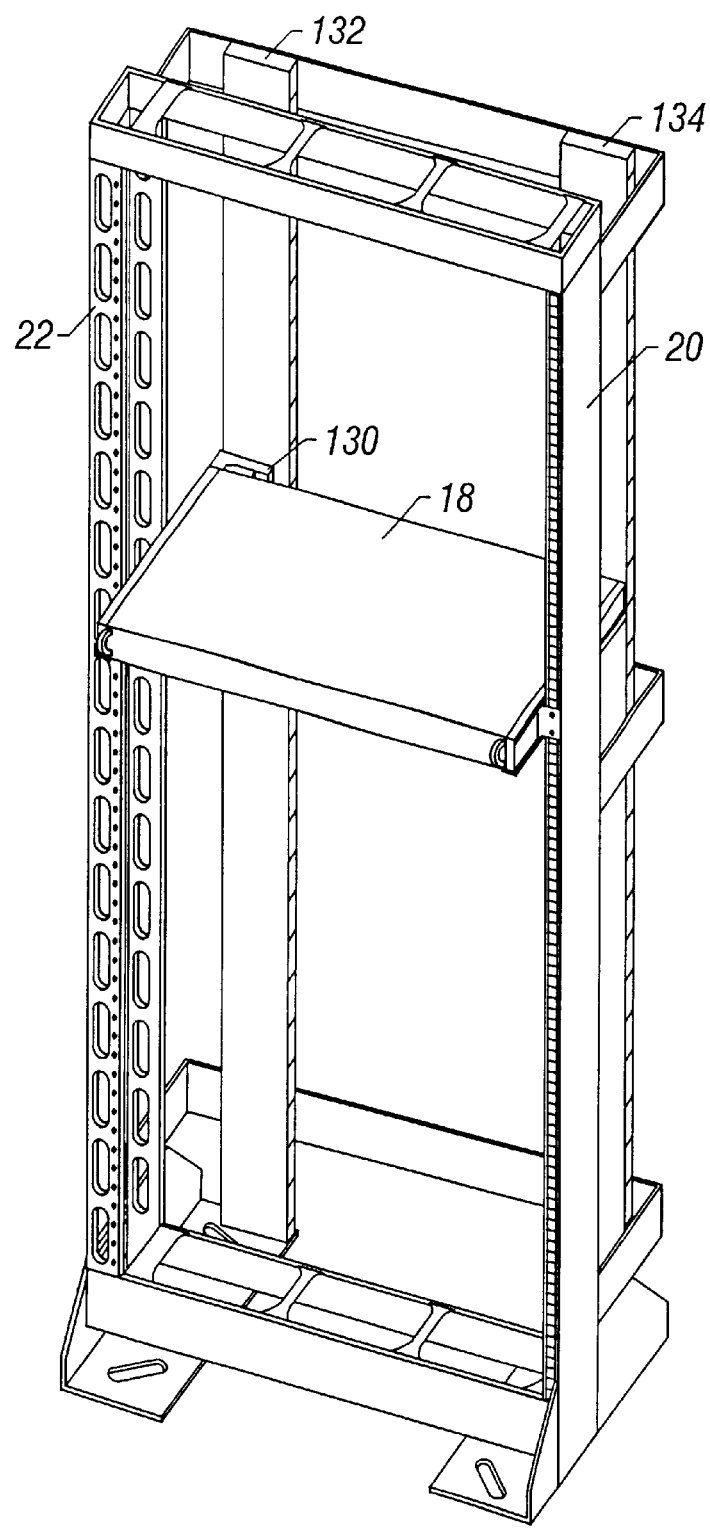
FIG. 6 is front perspective view of the chassis and slide assembly of the present invention installed into rack assembly.
Figure 7:
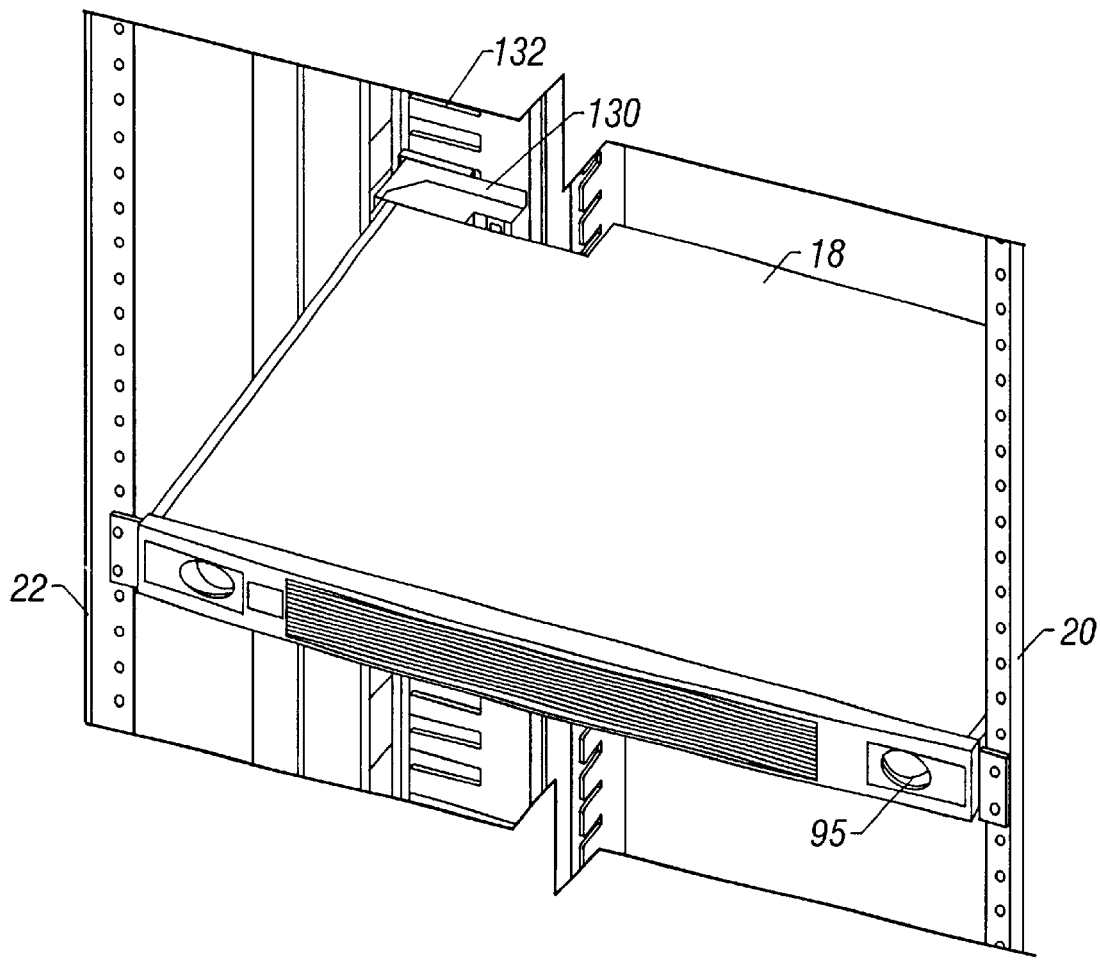
FIG. 7 is detailed perspective view similar to that of FIG. 6.

Referring to FIGS. 6–7, the slide assembly 12 coupled to the chassis 18 is shown to be mounted on the rack assemblies 20, 22 and disposed in the locked operational position. As seen, the interengageable mating members disposed on the rack assemblies 20, 22 are of a different embodiment than that shown in FIG. 1, but nevertheless serves the same function of permitting the chassis to be mounted thereon and demounted therefrom without the use of additional tooling or fasteners. FIGS. 6–7 further shows that the present invention permits "hot plugging" of electrical units (not shown) that are supported on the chassis 18 with electrical connectors 130 disposed the rear of the rack assemblies 20, 22 upon pushing the chassis 18 into the rack assembly to rest at its inner or locked operational position. Although not shown in detail, the rack assembly also includes a capture at the back which couples electrical connectors to various busbars for enabling electrical connections to various signal lines (e.g., AC input power, DC data bus slots, data line slots) associated with the telecommunication applications and which are required to be operational upon installation of the chassis. The electrical units have corresponding mating connectors (not shown) that are coupled to such electrical connections 130. The affirmative latching of the chassis in a locked operational position via a spring-loaded slide assembly relative to the rack assemble permits various mating connectors disposed on the electrical equipment and supported by the chassis to be coupled together in a manner where no extraneous movement of the chassis may disrupt such electrical connections.

Figure 8:
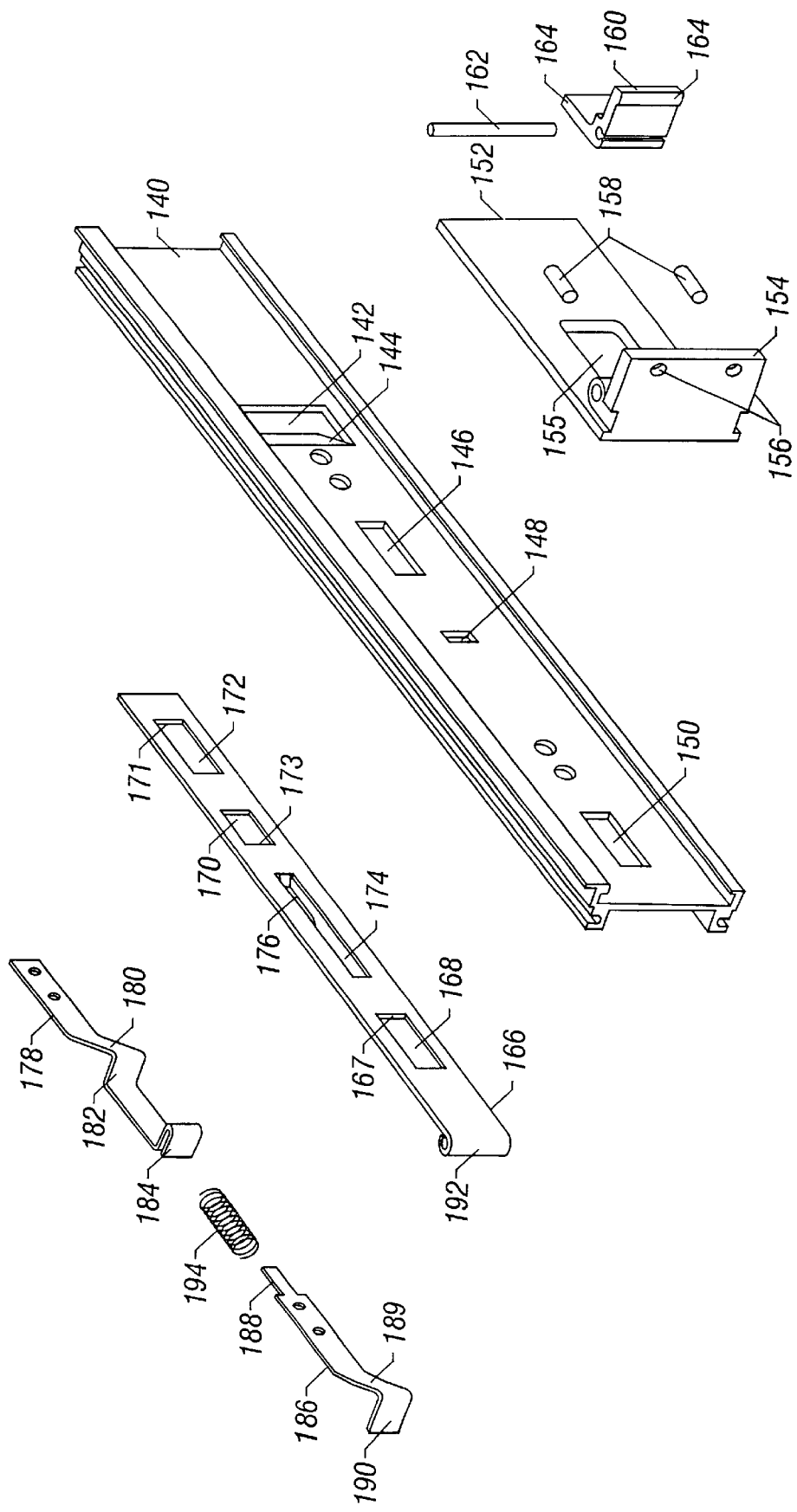
FIG. 8 is an exploded front perspective view of another embodiment of the slide member for the slide assembly of the present invention.
Figure 9:
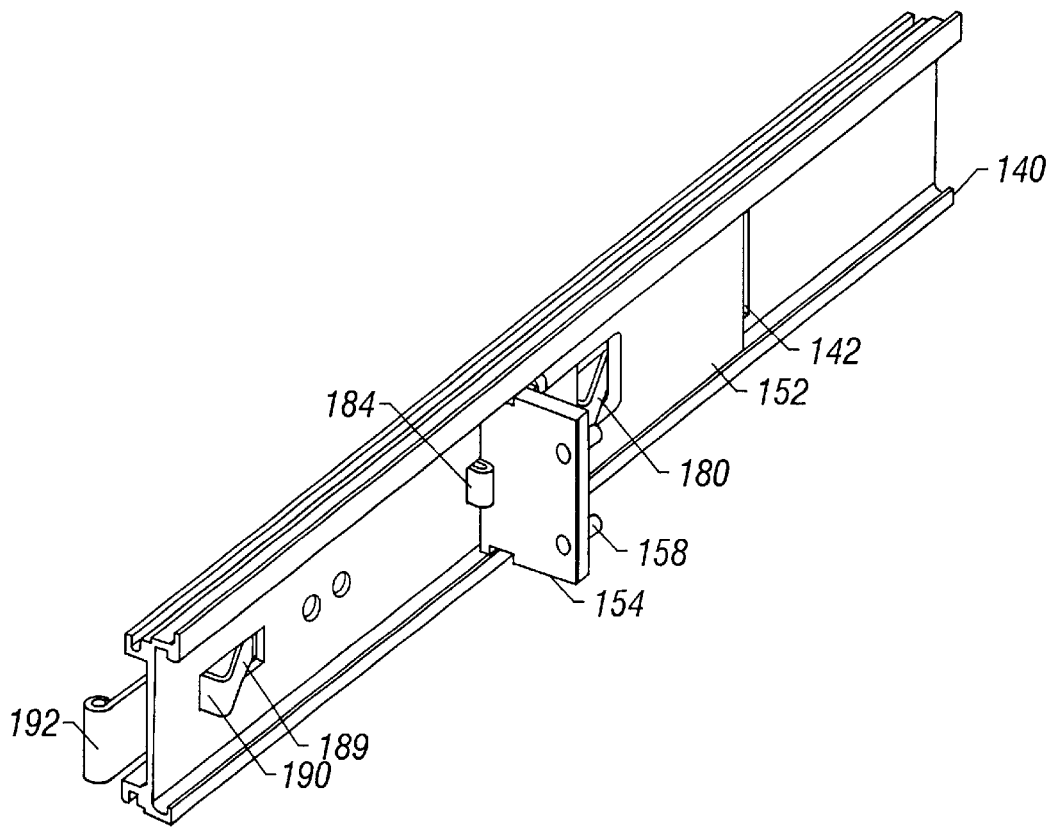
FIG. 9 is front perspective view of the slide assembly of FIG. 8.
Figure 10:
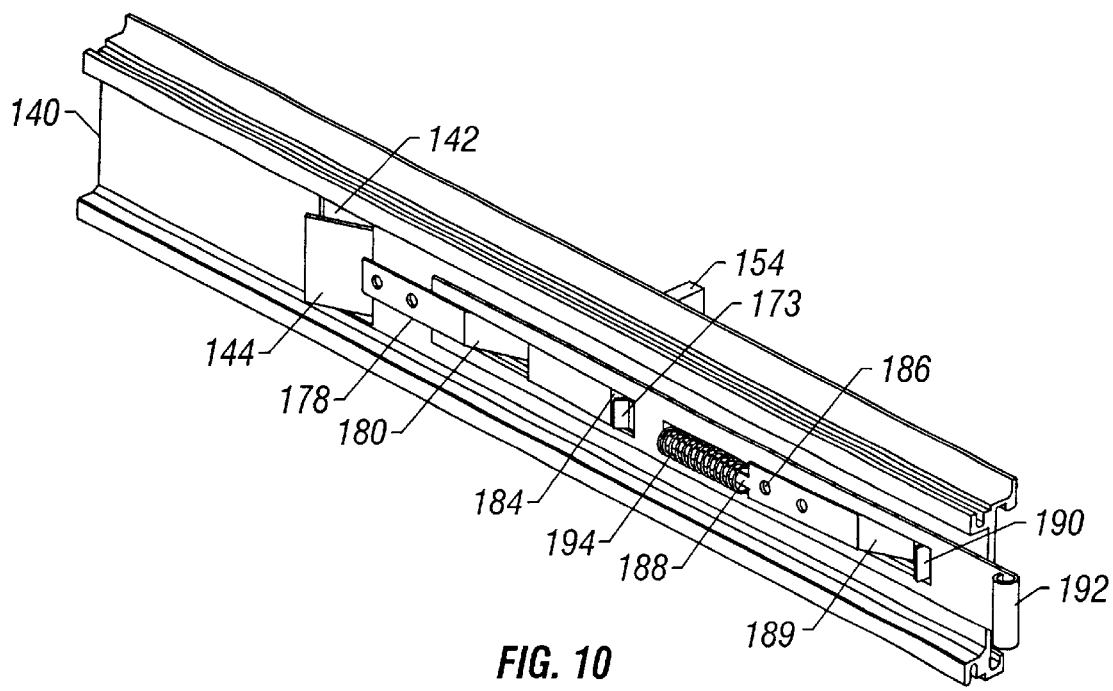
FIG. 10 is a rear perspective vies of the slide assembly of FIG. 8.

In an alternative embodiment of the present invention, the slide assembly may include a pair of slide members coupled to opposing sides of a chassis for slidable movement into three positions: an inner position, an intermediate position and an outer position. These positions offer multiple choices for accessing different parts of the electrical components supported on the chassis based upon inspecting such components from different vantage points based on how far out the chassis is pulled from the rack assembly. As seen in FIGS. 8–10, a track member 140 includes a notch 142 having a cam surface 144 similar in function to notch 26 and cam surface 28 previously described. The track member 140 further includes three openings 146, 148, 150 for receiving each of three stop members corresponding the latching of the track member in the inner, intermediate and outer positions.

The flange 152 has a first surface opposed from a second surface, a bracket 154 extending from the second surface of the flange and including cooperating portions in the nature of holes 156 for receiving guide pins 158 in order to mount the flange with a corresponding one of the vertical support members similar to that previously discussed. The flange 152 further has top and bottom edges each being received by a corresponding one of the channels on the track member and are enabled to permit slidable movement of the track member along the flange when the first surface of the flange abuts the first surface of the track member. The flange 152 also includes an opening 155 extending from the first surface of the flange to the second surface of the flange for preventing the slidable movement of the chassis when at the inner, intermediate and outer positions relative to the vertical support members.

A first latch member 178 is substantially resilient and has a cam surface 180 leading to a stop member 182, and another stop member 184. A second latch member 186 is also substantially resilient and has a spring support member 188 extending therefrom and a cam surface 189 leading to a stop member 190. The first latch member 178 and the second latch member 186 are coupled to the track member 140 in a similar manner as that shown in FIGS. 2–4 with respect to latch 82.

A spring loaded clamp 160 is pivotably supported by the flange 152 and normally biased in a direction from the second surface of the flange towards the first surface of the flange, whereby the clamp 160 is urged through opening 155 to engage the first surface of the track member during the slidable movement, to latch into the notch 142 for preventing the slidable movement beyond the back portion, to engage the stop member 182 when the chassis is in the inner position with cam surface 180 protruding through openings 172, 146, and 155 to engage the stop member 184 when the chassis is in the intermediate position with stop member 184 protruding through openings 170, 148 and 155, and to engage the stop member 190 when the chassis is in the outer position with cam surface protruding through openings 168, 150 and 155. Similar to that (i.e.. 74) of FIG. 1, a stop member (not shown in FIGS. 8–10) for preventing the slidable movement beyond the front portion may be included. The spring loaded clamp 160 is supported on the flange by a pin 162. Clamp 160 may include crowned surfaces 164 to permit racking, as well as steering rails.

A spring-loaded releasable lock actuator 166, similar to actuator 94, is coupled to the latches 178, 186 and has a handle 192, a first surface opposed from a second surface, means for attaching the latches 178, 186 to the track member 140 as similarly disclosed for actuator 94, an opening 172 having a vertical edge 171 and being adapted for retaining the chassis in the inner position when the cam surface 180 extends through openings 172, 146 and 155 and when the stop member 182 engages the vertical edge 171. Another opening 170 is adapted to include an extension 173 similar to extension 106, and adapted for retaining the chassis in the intermediate position when the stop member 184 engages the extension 173 and protrudes through openings 170, 148, and 155 to engage stop member 160. Another opening 168 includes a vertical edge 167 adapted for retaining the chassis in the outer position when the stop member 190 engages the vertical edge 167. An opening 174, similar to opening 108, is also included for receiving means for attaching the second latch to the track member. The handle 192 is positioned to extend away from the front portion of the track member 140. An arm 176 similar to arm 110 is inserted through spring 194 until one end of the spring engages an elbow thereon, and is coupled with spring support member 188 to keep spring 194 captive thereon.

Slidable movement is permitted: (1) when disengaging the track member 140 from the inner and intermediate positions by actuating said handle 192 to slide said lock actuator 166 toward the front portion to cause spring 194 to compress, thus causing the vertical edge 171 to slide along the cam surface 180 and to retract the stop member 182 from openings 172, 146 and out of engagement with the clamp 160 (this action also disengages stop member 184 from openings 170, 148 and 155); and, (2) when disengaging the track member 140 from the outer position by actuating the handle 192 to slide lock actuator 166 toward the front portion to cause the vertical edge 167 to slide along the cam surface 189 and to retract the stop member 190 from the openings 150, 168, and 155 and out of engagement with the clamp 160.

Although preferred and alternative embodiments of the present invention and modifications thereof have been described in detail herein, it is to be understood that this invention is not limited to those precise embodiments and modifications, and that other modifications and variations may be affected by one of ordinary skill in the art without departing from the spirit and scope of the invention as defined in the appended claims.

What is claimed is:

1. A slide assembly having a first portion which is mounted to vertical support members of a rack assembly, and a second portion which is mounted to a chassis for supporting the chassis in the rack assembly, said slide assembly including a pair of slide members each of said slide members comprising:

a movable track member having a first surface opposed from a second surface and being adapted so that said second surface engages a corresponding one of opposed sides of the chassis, a front portion, a back portion, a notch including a first cam surface disposed near the back portion, top and bottom edges shaped to form channels along said first surface, at least one of said channels including a first stop member near the front portion, a first opening disposed substantially in between the back portion and the front portion, and means for mounting the slide assembly to the chassis;

a flange having a first surface opposed from a second surface, a bracket extending from the second surface of the flange and including cooperating portions for mounting the flange with a corresponding one of the vertical support members, said flange further having top and bottom edges each being received by a corresponding one of said channels and enabled to permit slidable movement of said track member along said flange when the first surface of the flange abuts the first surface of the track member, and a second opening extending through the first surface of the flange and through the second surface of the flange;

a clamp pivotably supported by said flange and spring-loaded so as to be normally biased in a direction from the second surface of the flange towards the first surface of the flange, whereby said clamp is urged through said second opening to engage the first surface of the track member during said slidable movement and to latch into the notch for preventing said slidable movement beyond the back portion, said first stop member for preventing said slidable movement beyond the front portion;

a latch being substantially resilient and having a spring support member, and a second cam surface leading to a second stop member; and a spring-loaded releasable lock actuator coupled to the latch and having a handle, a first surface opposed from a second surface, a third opening adapted to include a vertical edge opposed from a first extension and adapted for retaining said chassis in a locked operational position relative to the support members when the second cam surface extends therethrough and when said second stop member engages said first extension, and a fourth opening for receiving means for attaching the latch to the track member, said handle being positioned to extend away from the front portion of the track member, wherein the slidable movement is permitted when unlocking the track member out of the operational position by actuating said handle to slide said lock actuator towards the front portion to thereby cause said vertical edge to slide along the second cam surface and to retract the second stop member from the third opening and out of engagement with the clamp.

2. The slide assembly of claim 1, wherein said actuator includes means for mounting a spring to the actuator and the latch.

3. The slide assembly of claim 1, wherein said track member comprises a glide.

4. The slide assembly of claim 1, wherein said vertical support members include a plurality of connection members for releasably engaging said cooperating portions.

5. The slide assembly of claim 1, wherein said assembly is formed from a material including an anodized metal.

6. The slide assembly of claim 1, wherein said vertical support members are selected from a group consisting of a rack and a framework structure.

7. The slide assembly of claim 1, further comprising a housing supported by the rack assembly.

8. The slide assembly of claim 1, wherein said bracket comprises an L-shaped bracket.

9. The slide assembly of claim 1, wherein said channels are substantially U-shaped channels.

10. The slide assembly of claim 1, further comprising a plurality of electrical connectors supported by the rear portion of the rack assembly, wherein said chassis supports electrical components containing interengageable connection members, and said interengageable connection members being received by corresponding ones of the electrical connectors when said chassis is pushed into the rack assembly and into the locked operational position.

11. The slide assembly of claim 2, wherein said means for mounting a spring comprises a compression spring defining a bore therein, an arm extending from the first surface of the actuator and formed to include an elbow coupled thereto, said arm being inserted through said bore so that one end of said spring abuts the elbow.

12. The slide assembly of claim 3, wherein said cooperating portions include apertures and said connection members include male latches.

13. The slide assembly of claim 4, wherein said cooperating portions are locating pins and said connector members are slots.

14. The slide assembly of claim 11, wherein said latch is supported by the track member when the second surface of the lock actuator engages the second surface of the track member, and when said means for attaching extends through the fifth opening and is coupled to said track member and said latch.

15. The slide assembly of claim 11, wherein said means for mounting a spring further includes a plurality of tabs extending from said latch to define a third opening, and wherein said spring is kept captive when the arm is inserted through the third opening to enable said latch to engage a second end of the spring.

16. A module mounting slide clamp mechanism having a pair of slide members supported by a chassis and mounted to a stable rack assembly, said slide members when installed with the rack assembly permitting slidable movement of the chassis into and out of the rack assembly, each of said slide members comprising:

a glide coupled to said chassis and including a track, a notch cut into one end of the glide and including a first cam surface, and a first bore;

a flange including a bracket extending therefrom for mounting a corresponding one of said slide members to said rack assembly and to enable said rack assembly to thereby stably support said chassis, said flange being received by said track so as to permit the slidable movement of said glide along said flange, and to thereby permit said slidable movement of the chassis, said flange further including a second bore;

clamp means pivotably supported by said flange and spring-loaded so as to be normally biased through said second bore, to engage the glide during said slidable movement, and to protrude through said notch and engage said first cam surface when the second bore is aligned with the notch so as to prevent said slidable movement beyond the notch; and means for latching said glide in a locked operational position relative to the rack assembly and for releasing said glide from said locked operational position, said clamp means engaging said means for latching and releasing when said glide is in the locked operational position, and said means for latching and releasing being supported by said glide, wherein the slidable movement is permitted when said glide is released from the locked operational position by disengaging the clamp means from the means for latching and releasing.

17. The module mounting slide clamp mechanism of claim 16, further comprising a plurality of electrical connectors supported by the rack assembly near said one end of the glide, wherein said chassis supports electrical components containing interengageable connection members, said interengageable connection members being received by corresponding ones of the electrical connectors when said chassis is pushed into the rack assembly and into the locked operational position.

18. A slide assemble having a first portion which is mounted to vertical support members of a rack assembly, and a second portion which is mounted to a chassis for supporting the chassis in the rack assembly, said slide assembly including a pair of slide members, each of said slide members comprising:

a movable track member having a first surface opposed from a second surface and being adapted so that said second surface engages a corresponding one of opposed sides of the chassis, a front portion, a back portion, a notch including a first cam surface disposed near the back portion, top and bottom edges shaped to form channels along said first surface, at least one of said channels including a first stop member near the front portion, means for mounting the slide assembly to the chassis, a first opening disposed near the front portion, a second opening disposed substantially in between the back portion and the front portion, and a third opening disposed between the first and second openings, wherein said openings extend from the first surface to the second surface of the track member;

a flange having a first surface opposed from a second surface, a bracket extending from the second surface of the flange and including cooperating portions for mounting the flange with a corresponding one of the vertical support members, said flange further having top and bottom edges each being received by a corresponding one of said channels and enabled to permit slidable movement of said track member along said flange when the first surface of the flange abuts the first surface of the track member, and a fourth opening extending from the first surface of the flange to the second surface of the flange, said slidable movement enabling movement of said chassis between inner intermediate and outer positions relative to the vertical support members;

a first latch member being substantially resilient and having a second cam surface member leading to a second stop member, and a third stop member;

a second latch member being substantially resilient and having a first spring support member extending therefrom and a fourth stop member;

a clamp pivotably supported by said flange and spring-loaded so as to be normally biased in a direction from the second surface of the flange towards the first surface of the flange, whereby said clamp is urged through said fourth opening to engage the first surface of the track member during said slidable movement, to latch into the notch for preventing said slidable movement beyond the back portion, to engage the second stop member when the chassis is in the inner position, to engage the third stop member when the chassis is in the intermediate position, and to engage the fourth stop member when the chassis is in the outer position, said first stop member for preventing said slidable movement beyond the front portion;

a spring-loaded releasable lock actuator coupled to the latches and having a handle, a first surface opposed from a second surface, means for attaching the first latch to the track member, a fifth opening having a first vertical edge and adapted for retaining said chassis in the inner position when the second cam surface extends therethrough and when the second stop member engages the first vertical edge, a sixth opening adapted to include an extension and adapted for retaining said chassis in the intermediate position when the third stop member engages the extension, and a seventh opening having a second vertical edge and adapted for retaining said chassis in the outer position when the fourth stop member engages the second vertical edge of the seventh opening, and an eighth opening for receiving means for attaching said second latch to the track member, said handle being positioned to extend away from the front portion of the track member, wherein the slidable movement is permitted when disengaging the track member from the inner and intermediate positions by actuating said handle to slide said lock actuator toward the front portion to cause the first vertical edge to slide along the second cam surface and to retract the second stop member from the fifth opening and out of engagement with the clamp, and when disengaging the track member from the outer position by actuating said handle to slide said lock actuator toward the front portion to cause the second vertical edge to slide along the third cam surface and to retract the third stop member from the seventh opening and out of engagement with the clamp.

19. The slide assembly of claim 18, further comprising a plurality of electrical connectors supported by the rear portion of the rack assembly, wherein said chassis supports electrical components containing interengageable connection members, and said interengageable connection members being received by corresponding ones of the electrical connectors when said chassis is pushed into the rack assembly and into the locked operational position.

20. The slide assembly of claim 19, further comprising a compression spring defining a bore therein and an arm extending from the first surface of the actuator and formed to include an elbow coupled thereto said arm being inserted through said bore so that one end of said spring abuts the elbow, wherein said second latch is supported by the track member when the second surface of the lock actuator engages the second surface of the track member, and when said means for attaching extends through the eighth opening and is coupled to said track member and said second latch.

* * * * *